United States Patent
Tuers et al.

(10) Patent No.: US 9,940,271 B2
(45) Date of Patent: *Apr. 10, 2018

(54) METHODS FOR USING PULSE SIGNALS IN MEMORY CIRCUITS

(71) Applicant: SANDISK TECHNOLOGIES LLC, Plano, TX (US)

(72) Inventors: Daniel Tuers, Kapaa, HI (US); Abhijeet Manohar, Bangalore (IN); Yoav Weinberg, Ontario (CA); Milton Lourenco Barrocas, San Jose, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/483,695

(22) Filed: Apr. 10, 2017

(65) Prior Publication Data
US 2017/0212849 A1 Jul. 27, 2017

Related U.S. Application Data

(63) Continuation of application No. 14/145,116, filed on Dec. 31, 2013, now Pat. No. 9,620,182.

(51) Int. Cl.
| | |
|---|---|
| *G06F 13/372* | (2006.01) |
| *G06F 13/16* | (2006.01) |
| *G06F 13/40* | (2006.01) |
| *G06F 13/362* | (2006.01) |
| *G06F 13/38* | (2006.01) |

(52) U.S. Cl.
CPC ........ *G06F 13/1689* (2013.01); *G06F 13/362* (2013.01); *G06F 13/385* (2013.01); *G06F 13/4068* (2013.01)

(58) Field of Classification Search
USPC .................................. 710/104–110, 306–317
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |

(Continued)

OTHER PUBLICATIONS

International Search Report and Written Opinion of the International Searching Authority for Application No. PCT/US2014/71417 dated Mar. 9, 2015, 9 pages.

(Continued)

*Primary Examiner* — Raymond Phan
(74) *Attorney, Agent, or Firm* — Foley & Lardner LLP

(57) ABSTRACT

In a memory system where multiple memory chips communicate their ready/busy status on a shared bus line, a pulse mechanism is used for the individual memory chips to indicate their ready/busy status to the controller. In one example, the controller assigns pulse durations of differing lengths to the memory dies to allow the controller to distinguish between them. Techniques for dealing with bus collisions between the pulses of different chips are also described.

20 Claims, 2 Drawing Sheets

(56) References Cited

U.S. PATENT DOCUMENTS

| | | | |
|---|---|---|---|
| 5,903,495 | A | 5/1999 | Takeuchi et al. |
| 6,046,935 | A | 4/2000 | Takeuchi et al. |
| 6,222,762 | B1 | 4/2001 | Guterman et al. |
| 7,330,944 | B2 | 2/2008 | Mylly |
| 7,350,044 | B2 | 3/2008 | Keays |
| 8,305,807 | B2 | 11/2012 | Shah et al. |
| 8,429,313 | B2 | 4/2013 | Smith et al. |
| 8,560,764 | B2 | 10/2013 | Huffman et al. |
| 9,620,182 | B2 * | 4/2017 | Tuers ................ G11C 7/22 |
| 2005/0268025 | A1 | 12/2005 | Smith et al. |
| 2011/0153914 | A1 | 6/2011 | Huffman et al. |
| 2011/0258366 | A1 | 10/2011 | Schuetz et al. |
| 2015/0149694 | A1 | 5/2015 | Tuers et al. |

OTHER PUBLICATIONS

U.S. Notice of Allowance on U.S. Appl. No. 14/145,116 dated Dec. 5, 2016.
U.S. Office Action on U.S. Appl. No. 14/145,116 dated Aug. 8, 2016.
Office Action issued on Taiwan Application 103145957, dated Feb. 7, 2018, English translation not available.

* cited by examiner

METHODS FOR USING PULSE SIGNALS IN MEMORY CIRCUITS

CROSS-REFERENCE TO RELATED APPLICATIONS

This application is a continuation of U.S. application Ser. No. 14/145,116, filed on Dec. 31, 2013, the entirety of which is incorporated by reference herein.

FIELD

This application pertains generally to the field of non-volatile memory systems and, more particularly, to the signals interchanged between the controller and the memory chips within such systems.

BACKGROUND

Non-volatile memory systems, such as memory cards, solid state drives (SSDs) or embedded non-volatile memories (such as iNAND), are typically formed of a controller circuit and a number of memory chips. These memory chips are connected to the controller over a bus structure, where it is common for multiple memory chips to share a common bus structure having shared ready/busy (RB) line. For example, a single ready busy line can be shared by up to 16 dies, where only the actively selected die (including the chip enable (CE)) can use the ready/busy line at any given time. A baseline method of checking if a die is ready is by selecting the die and then sampling or polling the ready/busy signal. An alternative design is to select a die then use the check status command across the data bus to check a die's status. However, constant polling is inefficient and leads to higher power consumption. Cycling through dies selecting dies to check the status adds latency and increases power. In older memory systems, as instructions for similar operations were typically issued serially through the set of dies, this was not so much of limitation, but as memory die become more autonomous and their operations vary more in timing, this situation has become limiting on memory systems.

SUMMARY

According to a first set of general aspects, a non-volatile memory system includes a plurality of memory circuits, each including one or more arrays or non-volatile memory cells, and a controller circuit to control the transfer of data between the memory circuits and a host connected to the memory system and to manage the storage of data on the memory circuits. A bus structure connects the controller circuit with the memory circuits, where the bus structure includes a common first bus line on which the memory circuits indicate to the controller circuit their ready/busy status. Each of the memory circuits indicates its ready/busy status by application of a pulse to the first bus line.

Further aspects relate to a non-volatile memory circuit having an array of non-volatile memory cells and read-write circuitry connected to the array. The memory circuit also has a plurality of contact pins, including a first pin, and a cache memory to store data being transferred between the pins and the array. A state machine on the memory circuit indicates the ready/busy status of the memory circuit on the first pin according to one or more modes, including a first mode wherein ready/busy status is indicated by a pulse settable to one of a plurality of durations.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Figure 1:
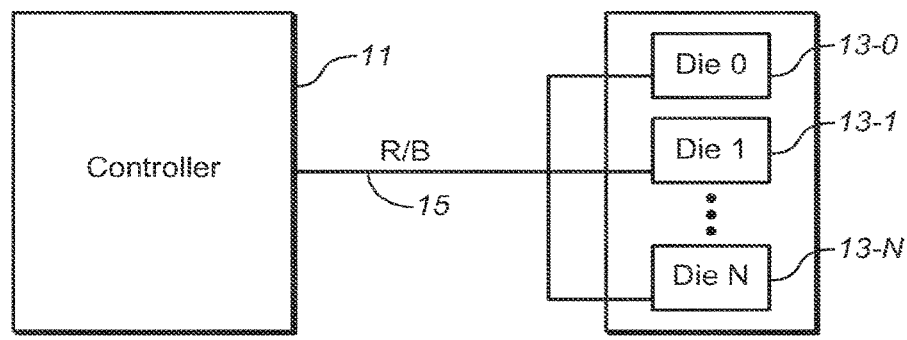
FIG. 1 is a physical representation of a memory system where multiple memory dice share a common ready/busy line with a controller circuit.

As discussed in the Background, non-volatile memory systems having large numbers of memory chips, such as a NAND based solid state drive (SSD), sharing a single ready/busy (RB) line on a common bus structure can suffer from inefficiencies with respect to both speed and power. This can be particularly limiting in multi-threaded systems, such as that described in U.S. patent application Ser. No. 14/090,247 filed on Nov. 26, 2013. The techniques described in the following are aimed at eliminating the need to poll each die in the system to check if it is ready to accept a new command.

In an exemplary embodiment, the dice can be configured in two modes, where one mode the dice is a default to the legacy ready/busy mode. In a second mode, broadcast command (issued by the controller) converts all the dies over to the new pulse width ready/busy logic. Another mode is the device defaults to the digital signal, such as if the controller switches over to this mode and switches back. The assigning of differing durations for the signals can be option, where the memory chips can default to a working set of durations with a single packaging of dice. For example, the width of the pulses can be in units of the memory circuit's internal clock frequency, but can alternately be made smaller or larger. In other embodiments, the pulse lengths could be based on other clocks on the system, such a data bus clock signal, which is typically of a higher rate that memory chip's internal clock. The pulse width emanating from each die can be uniform in length or the controller's firmware can optionally program each of the die's pulse widths.

Programming the pulse widths would prevent collisions from different chip packages. After doing die select, the system no longer needs to pause and wait for ready/busy to transition. For example on a four die chip, CE0-die0 may have a pulse width of 1 cycle, where CE1-die0 might have a pulse width of 5 cycles. Here, CE0 and CE1 are chip enable signals that are part of the set of control signals (such as write strobe, read strobe, command latch, ready/busy, and so on) used on the system bus. These signals typically are commonly fed to multiple chips on the system, with the CE signal used to select a "package" of multiple dice. When there are multiple packaged parts on a bus, the different chip enable signals would apply to the die of different packages.

An exemplary embodiment involves sending a signal to the controller every time a die changes state from busy to ready. The design of the R/B pin would change from the prior analog design to a digital design. When a die creates a busy to ready transition (either true ready transition or cache ready transition) it generates a pulse. The pulse and its width are then detected by the controller. The width of the pulse indicates to the controller which die became ready. Once a pulse is received, the firmware queries the NAND (or, more generally, the memory circuit) by sending a check status command (this is a verify operation). There is no interaction needed with the die till a pulse is received. The die can be either cache ready or true ready. If the firmware is looking for a true ready signal and wakes up on receiving a pulse, but sees that the die is cache ready, then it can go back to sleep and query again when it sees another pulse. Controller timers, such as those described in U.S. patent application Ser. No. 14/090,247, can act as watchdogs and be slightly relaxed to allow the pulse mechanism to have higher priority.

Figure 2:
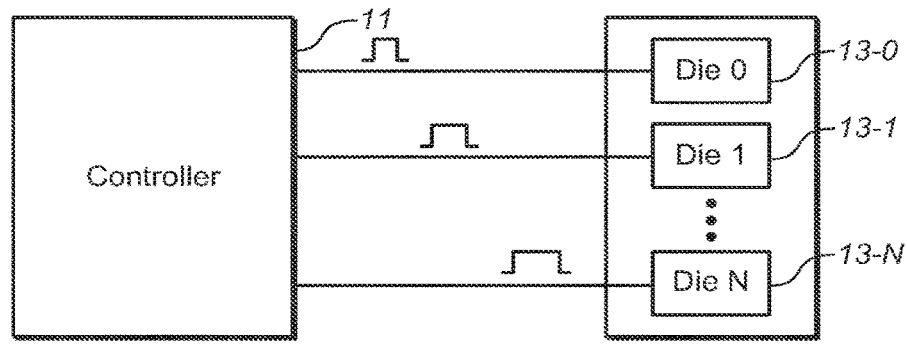
FIG. 2 is schematic representation for an exemplary embodiment of the logical implementation of ready/busy signals for the physical system of FIG. 1.

FIG. 1 schematically illustrates the elements of the memory system, both for a typical prior art legacy implementation and for the pulse based arrangement described here. In the following discussion, the exemplary embodiment uses a single dedicated ready/busy line common to all (or at least multiple ones) of the memory chips, which in turn have a dedicated RB pin; but, more generally, this the same technique could applied to a status pulse applied on any of the pins along a corresponding bus line for the controller. For both cases, at least in terms of their physical representation, a controller circuit 11 is connected to memory circuits die 0-N, 13-0 to 12-N, over a common bus 15 that includes a shared ready/busy line RB. In the legacy mode, typical of the prior art, the ready/busy status based on whether the R/B line is high or low. In the pulse mode, the different dice indicate their respective status by a pulse, so the logical implementation is represented schematically in FIG. 2, where each of the dice has an individual indication of status. However, as FIG. 2 just a representation of the logical situation, while the physical structure is that of the common R/B line in FIG. 1, there is the possibility of a bus collision should more than one of the dice have pulses on the line at the same time. The bus collision situation and mediation is considered below.

Figure 3:
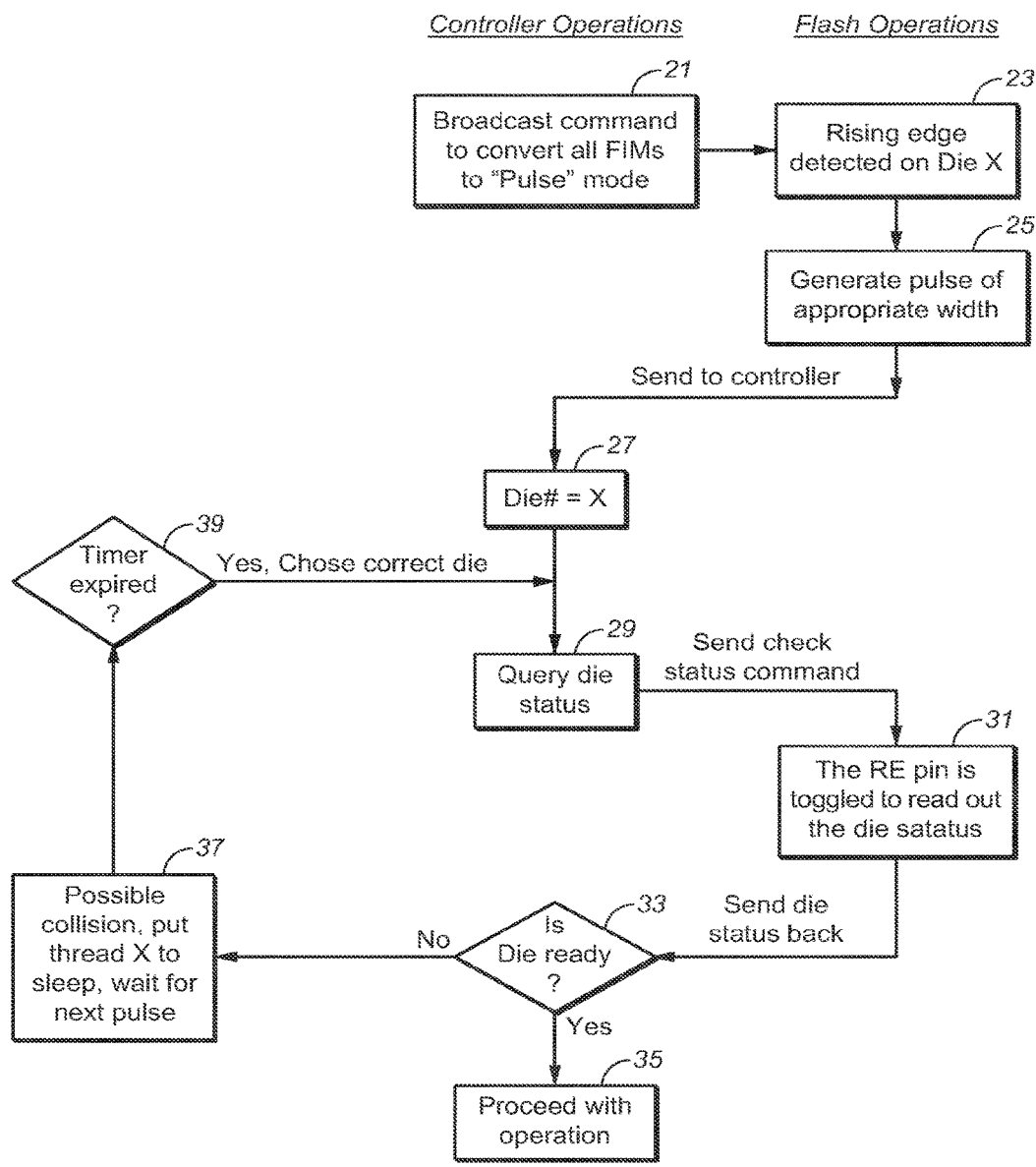
FIG. 3 is an exemplary flow of operations.

FIG. 3 is a flowchart for an exemplary embodiment of the flow, where the controller operations are to the left and the operations on the memory chip operations are on the right. Starting at 21, the controller broadcasts a command to convert all flash interface modules (FIMs) to the pulse mode. (More detail on the flash interface modules, multi-thread operations, and controllers in general is given in U.S. patent application Ser. No. 14/090,247 and references cited therein.) At 23, a rising edge is detected on Die X, in response to which a pulse of the appropriate width is generated at 25 and put out on the ready/busy line. (In an alternate embodiment, all of dice could use the same pulse length, with the responsible die located by a more extensive query at 29, below.)

The pulse is received at the controller, which can then identify the die's number at 27 as die X based upon the pulse. As 29, the controller issues a Query Die status and the check status command is sent out. (This query process starting at 29 is optional and can be skipped if the system is consider sufficiently reliable in this regarded.) The RE (read enable) pin is toggled to read out the die's status, which is then sent back to the controller to determine whether the die is ready at 33. If the die is ready, then the operation can proceed at 35. The ready can be either a true ready or a cache ready, where in the case of a cache ready, the controller may query the die for a true ready after a delay. The length of the delay can be defined by the type of operation to be performed, with the delay such that it is greater than the expected time the operation should take to help ensure that the memory is ready.

If, instead the die is not ready or the result is ambiguous, this could be the result of a bus collision and, rather than proceed with the operation, the controller should resolve the possible collision. In the exemplary flow at 37 the thread of X is put to sleep and the controller waits for the next pulse. At 39 the controller waits for the timer to expire and, when it does, the process loops back to 29.

As discussed above, in a multi-die system it becomes necessary to identify exactly when a die is ready to accept commands. In order to differentiate the dice, the pulses that are sent to the controller to indicate NAND ready can be of different widths. Although the likelihood is lowered by issuing operations serially, there is still a possibility that multiple dice can be ready at the same time and send overlapping pulses to the controller to indicate that they are ready. This scenario is referred to as a bus collision. To reduce the frequency of such collisions, one option is for the memory die to sample the bus for another die transmitting before it starts to transmit.

There can be three outcomes detected for the pulse sampling: 1) The pulse width in such a scenario may not match any of the configured pulse widths; 2) The combined pulse width may indicate that another die in the chip is ready; or 3) One die's status gets lost in another die's pulse width. Scenario 1 and 2 can be resolved by a status check operation, where the controller queries the putative die (which is different from the ones the pulses actually came from) and then realizes the mistake. As the controller cannot resolve the collision, it can wait for the timers, such as those of U.S. patent application Ser. No. 14/090,247, to go off. In scenario 2, the status received is invalid (meaning the indicated die is busy), so that the timers for the two threads (that are actually ready) will expire and the dice are queried to check the ready status, allowing the collision to be resolved. In scenario 3, the timers expire and the lost die gets serviced. Optionally, the memory circuit could detect that another die was driving the ready/busy line at the same time then they could use a back off algorithm and rebroadcast the ready status. With the pulse width programmable, multiple chips can be managed without having the need to switch between the chip enables.

Figure 4:
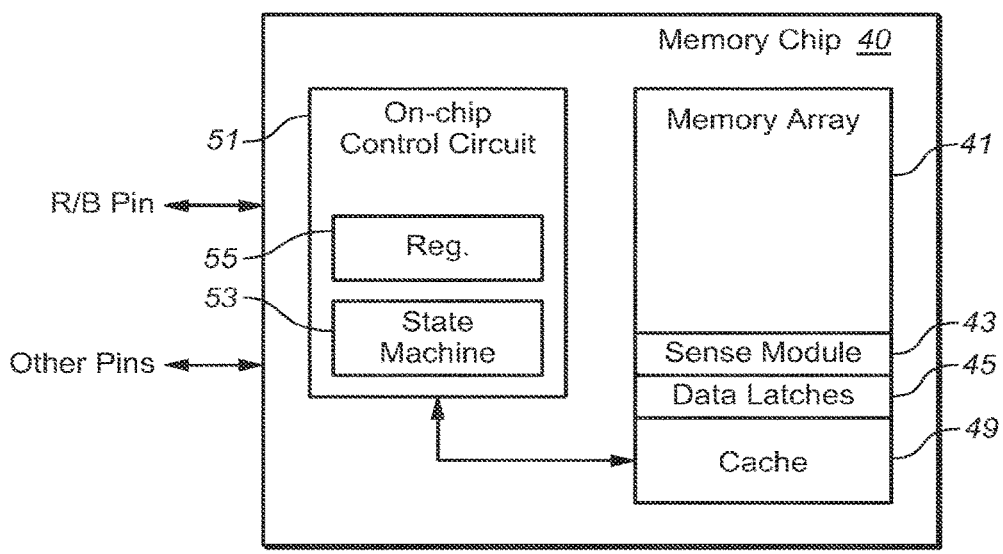
FIG. 4 is a simplified diagram of one of the memory die.

More detail on NAND and other non-volatile memory circuits, such as Die 0-N, 13-0 to 13-N, of FIG. 1 are described in more detail in U.S. Pat. Nos. 5,070,032; 5,095,344; 5,315,541; 5,343,063; 5,570,315; 5,661,053; 5,313,421; 5,903,495; 6,046,935; and 6,222,762, but some of the more relevant elements are illustrated in the simplified representation of FIG. 4. The memory chip 40 includes a memory array 41 of memory cells with each cell capable of being configured as a multi-level cell ("MLC") for storing multiple bits of data. The memory chip also includes peripheral circuits such as write and read circuitry, including sense modules 43, data latches 45 and on-die cache memory 49. An on-chip control circuitry 51 controls low-level memory operations of each chip. The control circuitry 51 is an on-chip controller that cooperates with the peripheral circuits to perform memory operations on the memory array 41. The control circuitry 51 typically includes a state machine 53 to provide chip level control of memory operations. The on-chip control circuit can also have a set of registers 55, such as could hold the die's assigned pulse duration: when the controller assigns the different pulse lengths to the dice, the value can be save in such a volatile register, in non-volatile memory, both.

The die will also have a number of pins for connection to the bus structure, as indicated collectively by the arrow to the left, with the R/B pin singled out for the purposes of this discussion. As noted above, in the exemplary embodiment, the on-chip control circuitry can operate the die in either a pulse mode or a legacy mode, wherein the state machine indicates the ready/busy status by the level on the ready/busy pin. As with the pulse duration, the mode of operation can be set according to a command received from the controller.

To help minimize bus collisions, as noted above, the machines can determine whether bus line to which the ready/busy pin is connected is free prior to applying the pulse to the ready/busy pin. This can be done by sampling the pin's status prior to driving the pulse. Alternately, or additionally, the die can sample the pin status after driving the pulse and detect whether its pulse collided with a larger (or otherwise overlapping) pulse from another, in which case it could resend the signal.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method, comprising:
   receiving, by a controller, a pulse signal on a shared bus line, wherein the pulse signal is indicative of a ready status or a busy status and is transmitted by one of a plurality of memory circuits connected to the controller via the shared bus line;
   determining, by the controller, a pulse duration of the received pulse signal; and
   identifying, by the controller, the one of the plurality of memory circuits that transmitted the pulse signal from the pulse duration, wherein the pulse duration of the pulse signal for each of the plurality of memory circuits is distinct.

2. The method of claim 1, further comprising:
   sending, by the controller, a check status command to the one of the plurality of memory circuits that transmitted the pulse signal for determining if the one of the plurality of memory circuits is ready for performing an operation.

3. The method of claim 1, wherein the pulse duration is a function of an internal clock of the plurality of memory circuits.

4. The method of claim 1, further comprising resolving, by the controller, a collision condition detected when the pulse duration of the pulse signal does not match the pulse duration of any of the plurality of memory circuits.

5. The method of claim 2, wherein, in response to sending the check status command, the controller receives a status indication back from the one of the plurality of memory circuits.

6. The method of claim 5, wherein the status indication is obtained by toggling a read enable pin of the one of the plurality of memory circuits.

7. The method of claim 5, wherein the status indication is one of a true ready indication or a cache ready indication, and wherein if the status indication is the true ready indication, the controller proceeds with performing the operation.

8. The method of claim 5, wherein the status indication is either a true ready indication or a cache ready indication, and wherein if the status indication is the cache ready indication, the controller sends another check status command to the one of the plurality of memory circuits after a delay.

9. The method of claim 5, wherein the controller sends another check status command to additional ones of the plurality of memory circuits if the status indication is a busy indication.

10. The method of claim 8, wherein a duration of the delay is defined by a type of a previous operation sent by the controller to the one of the plurality of memory circuits, and wherein the duration is set to be greater than an expected completion time of the previous operation.

11. A method, comprising,
    sending, by one of a plurality of memory circuits, a pulse signal on a shared bus line to a controller, wherein each of the plurality of memory circuits is connected to the controller via the shared bus line, and wherein each of the plurality of memory circuits is identifiable by a pulse duration of the pulse signal, and wherein the pulse duration of each of the plurality of memory circuits is distinct;
    receiving, by the one of the plurality of memory circuits, a check status command from the controller in response to transmitting the pulse signal; and
    transmitting, by the one of the plurality of memory circuits, a status indication to the controller in response to the check status command.

12. The method of claim 11, further comprising performing, by the one of the plurality of memory circuits, an operation requested by the controller upon the status indication being a true ready indication.

13. The method of claim 11, wherein upon transmitting a cache ready indication as the status indication, the method further comprises receiving, by the one of the plurality of memory circuits, another check status command from the controller after a delay.

14. The method of claim 11, further comprising:
    sampling, by the one of the plurality of memory circuits, the shared bus line before transmitting the pulse signal on the shared bus line; and
    transmitting, by the one of the plurality of memory circuits, the pulse signal on the shared bus line if the shared bus line is not being used by other ones of the plurality of memory circuits.

15. A method, comprising:
    receiving, by a controller connected to a plurality of memory circuits via a shared bus line, a pulse signal from one or more of the plurality of memory circuits on the shared bus line, wherein the pulse signal of each of the memory circuits has a distinct pulse duration;
    detecting, by the controller, a collision condition from the pulse signal received on the shared bus line; and resolving, by the controller, the collision condition by sending one or more check status commands to one or more of the plurality of memory circuits.

16. The method of claim 15, wherein the controller detects the collision condition from the pulse signal if the pulse duration of the pulse signal does not match the pulse duration of any of the plurality of memory circuits.

17. The method of claim 15, wherein the controller detects the collision condition from the pulse signal if the pulse duration indicates a first memory circuit of the plurality of memory circuits, and the controller receives a not ready indication back from the first memory circuit in response to sending an instance of the one or more check status commands.

18. The method of claim 17, wherein in response to receiving the not ready indication from the first memory circuit, the controller sends another instance of the one or more check status commands to additional ones of the plurality of memory circuits other than the first memory circuit.

19. The method of claim 15, further comprising, additionally detecting, by a first memory circuit of the one or more of the plurality of memory circuits, the collision condition by determining that a second memory circuit is driving the shared bus line at the same time as the first memory circuit.

20. The method of claim 19, wherein the first memory circuit retracts the pulse signal that the first memory circuit transmitted on the shared bus line upon detecting the collision condition and retransmits the pulse signal after a delay.

* * * * *